United States Patent
Lefebvre et al.

(10) Patent No.: US 10,043,930 B2
(45) Date of Patent: Aug. 7, 2018

(54) HIGH TEMPERATURE ACRYLIC SHEET

(75) Inventors: Amy A. Lefebvre, Pottstown, PA (US); Jiaxin Jason Ge, Lower Providence, PA (US); Michael T. Burchill, Langhorne, PA (US); Florence Mehlmann, King of Prussia, PA (US)

(73) Assignee: ARKEMA FRANCE, Colombes (FR)

( * ) Notice: Subject to any disclaimer, the term of this patent is extended or adjusted under 35 U.S.C. 154(b) by 298 days.

(21) Appl. No.: 13/129,958

(22) PCT Filed: Nov. 17, 2009

(86) PCT No.: PCT/US2009/064704
§ 371 (c)(1),
(2), (4) Date: May 18, 2011

(87) PCT Pub. No.: WO2010/062809
PCT Pub. Date: Jun. 3, 2010

(65) Prior Publication Data
US 2011/0226313 A1    Sep. 22, 2011

Related U.S. Application Data

(60) Provisional application No. 61/118,219, filed on Nov. 26, 2008.

(51) Int. Cl.
*H01L 31/048* (2014.01)
*C08L 33/12* (2006.01)

(52) U.S. Cl.
CPC ............ *H01L 31/048* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 6,660,930 B1 * | 12/2003 | Gonsiorawski | 136/251 |
| 2003/0004271 A1 | 1/2003 | Faris et al. | |
| 2004/0191422 A1 * | 9/2004 | Kataoka et al. | 427/553 |
| 2007/0009752 A1 * | 1/2007 | Lefebvre et al. | 428/500 |
| 2008/0058466 A1 * | 3/2008 | Joshi et al. | 524/567 |
| 2008/0196760 A1 * | 8/2008 | Hayes et al. | 136/256 |
| 2010/0000601 A1 | 1/2010 | Burchill | |
| 2010/0258162 A1 | 10/2010 | O'Brien et al. | |

FOREIGN PATENT DOCUMENTS

WO    WO 2008019229 A2 *    2/2008
WO    WO2010/051149         5/2010

OTHER PUBLICATIONS

Sigma-Aldrich, Thermal Transitions of Homopolymers: Glass Transition & Melting Point, Reference: Polymer Properties, retrieved Aug. 15, 2013, pp. 52-53.*

(Continued)

*Primary Examiner* — Callie E Shosho
*Assistant Examiner* — Patrick Noland English
(74) *Attorney, Agent, or Firm* — Thomas F. Roland

(57) ABSTRACT

The invention relates to an acrylic sheet having a high Tg, and especially for the use of the high Tg acrylic sheet as a front sheet of a photovoltaic module. The high Tg acrylic polymer is a copolymer of polymethylmethacrylate and one or more higher Tg monomers.

5 Claims, 1 Drawing Sheet

(56) References Cited

OTHER PUBLICATIONS

Zaikov et al., Kinetics & Mechanisms of Chemical Reactions, Nova Publishers, Jan. 1, 2005, p. 290.*
Menczel et al., Thermal Analysis of Polymers, John Wiley & Sons Inc., 2009, p. 68.*
Mahoney. A. R.. et al.. "Accelerated UV-Aging of Acrylic Materials used in PV Concentrator Systems", Sandia National Laboratories, (1993), pp. 1216-1221.
Rainhart. L. G.. et al., "Effect of Outdoor Aging on Acrylic Sheet", . Solar Energy, vol. 17. (1974), pp. 259-264.
Burkhardt. W. C.. "Solar Collector Glazing: Design Considerations for Acrylic and Polycarbonate", Proceedings of the 1979 National Conference on Technology for Energy Conservation, (1979), pp. 254-263.

* cited by examiner

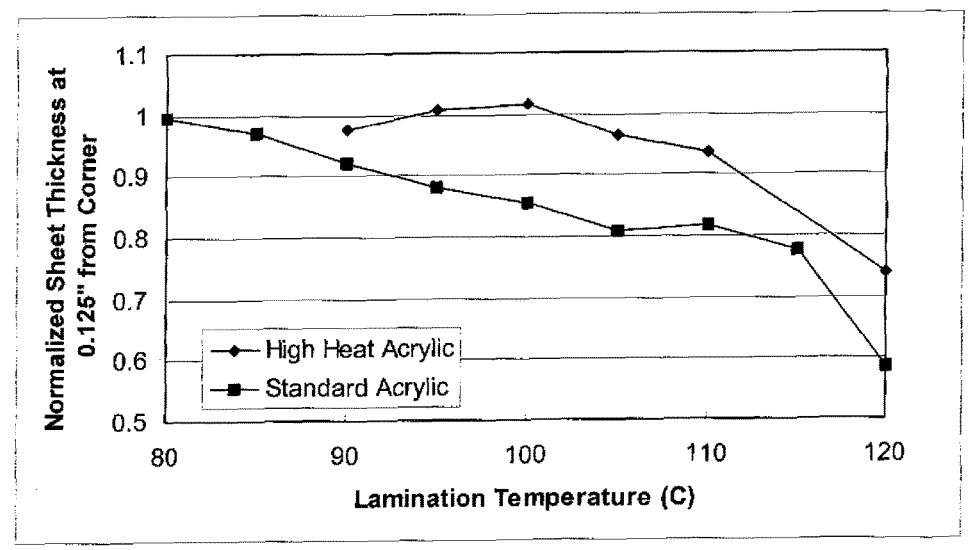

HIGH TEMPERATURE ACRYLIC SHEET

FIELD OF THE INVENTION

The invention relates to an acrylic sheet having a high Tg, and especially for the use of the high Tg acrylic sheet as a front sheet of a photovoltaic module. The high Tg acrylic polymer is a copolymer of polymethylmethacrylate and one or more higher Tg monomers.

BACKGROUND OF THE INVENTION

Acrylic polymer sheet such as PLEXIGLAS polymethyl methacrylate (PMMA) sheet (Arkema Inc.) is an optically clear plastic having superior optical clarity and excellent weathering performance as well as a lower specific gravity than glass, making PMMA a lighter weight material. Because of its excellent properties and lower weight PMMA is often used as a replacement for glass.

Photovoltaic (PV) modules generally have low iron tempered glass front panels, due to a need for high light transmittance (>90.5%) and excellent weathering performance. However, the glass front panels are generally heavy (bulk density ~2.5 g/cm$^3$) and fragile.

The use of acrylic sheet as glazing for a photovoltaic module is described in WO 08/19229, including the use of PMMA sheet having a polyvinylidene fluoride coating for dirt-shedding. Unfortunately, issues can arise from the use of standard PMMA sheet in a photovoltaic module.

Generally, PV modules are manufactured by a lamination process in which many or most of the separate components are heated together at a temperature in the range of 130° C. to 150° C. for up to 45 minutes to enable crosslinking of an encapsulate, and seating of the other components. In use, photovoltaic modules have been reported to experience continuous temperatures of between −10° C. and 130° C. Standard acrylic sheets have a maximum recommended continuous service temperature of between 63° C. and 102° C.

Specialty acrylic sheets can be produced having maximum continuous service temperatures of up to 115° C. and even higher temperatures for shorter periods of time, without significant deformation.

U.S. Pat. No. 6,653,405 describes a blend of PMMA with a poly(methylmethacrylate-co-t-butyl methacrylate) copolymer to produce a high Tg acrylic with good clarity and low haze, useful for coverings on lamps.

Higher Tg acrylic copolymers have been used for outdoor applications, including in PV concentrator systems (Mahoney et al. "Accelerated UV-aging of Acrylic Materials used in PV Concentrator Systems" Sandia National Laboratories, Albuquerque, N. Mex.). The reference describes Plexiglas® P55, a methylmethacrylate-methacrylamide copolymer with 4.8% methacrylamide, and having a Tg of approximately 122° C. as measured by DSC. The other acrylic materials (V811, Plexiglas® K, and Implex) described in the reference have Tg's≤105° C. Unfortunately, the poor solubility of methacrylamide in methylmethacrylate limits the methacrylamide level to 5 wt % in a methylmethacrylate-methacrylamide copolymer, thereby limiting the maximum achievable glass transition temperature to approximately 122° C. as measured by DSC. The methylmethacrylate-methacrylimide copolymer also tends to yellow under certain conditions.

Applicant has found that high Tg acrylic copolymer sheet can be used as a front glazing on a photovoltaic module, providing higher performance and good weathering without significant deformation of the acrylic sheet. Useful acrylic copolymers contain no acrylamide or methacrylamide monomer units, while terpolymers may contain up to 3 weight percent acrylamide or methacrylamide monomer units.

SUMMARY OF THE INVENTION

The invention relates to a photovoltaic (PV) module comprising:
a) a front acrylic glazing material having a Tg of 110° C. or greater, as measured by differential scanning calorimetry (DSC), comprising a polymer having at least 50 weight percent of methylmethacrylate units and at least 1 weight percent of high Tg monomer units having a Tg (of the homopolymer of the monomer) of greater than 120° C., wherein if said polymer is a copolymer it comprises no acrylamide or methacrylamide; and if said polymer is a terpolymer, the terpolymer may contain 0 to 3 weight percent of acrylamide or methacrylamide units along with at least one other high Tg monomer;
b) an interior layer capable of converting solar radiation into electricity; and
c) a back layer.

BRIEF DESCRIPTION OF THE DRAWINGS

FIG. 1 is plot of normalized sheet thickness compared to temperature, showing that the high Tg material of the invention retains it's dimensions better that standard acrylic sheet.

DETAILED DESCRIPTION OF THE INVENTION

The invention relates to photovoltaic modules having an acrylic glazing, wherein said glazing has a high Tg. The high Tg acrylic glazing can be a cast or extruded film or sheet, and is a copolymer of methylmethacrylate and at least one other monomer (denoted as a "high Tg monomer") having a homopolymer Tg greater than that of polymethylmethacrylate (PMMA) (Tg 105° C.). The acrylic glazing could also be a blend of an acrylic polymer and at least one miscible polymer, in which the overall Tg is greater than 110° C. By "high Tg" as used herein means a Tg of 110° C. or greater, preferably 115° C. or greater, more preferably 120° C. or greater, and even 125° C., 130° C. or greater as measured by differential scanning calorimetry during the second heating cycle using a heating rate of 20° C./min.

By "copolymer" as used herein means a polymer having two or more different monomer units. The copolymer could be a terpolymer with three or more different monomer units, or have four or more different monomer units. The copolymer may be a random copolymer, a gradient copolymer, or could be a block copolymer formed by a controlled polymerization process. The copolymer could also be a graft copolymer, or have a controlled structure such as a star or comb. Preferably, the copolymer is formed by a free radical polymerization process, and the process can be any polymerization method known in the art, including but not limited to emulsion, solution, suspension polymerization, and can be done in bulk, semi-bulk or delayed feed.

The acrylic copolymer contains at least 50 weight percent of methylmethacrylate monomer units, and preferably at least 75 weight percent and more preferably at least 85 weight percent methylmethacrylate monomer units. The copolymer contains from 1 to just less than 50, preferably 2 to 25, and more preferably 5 to 15 weight percent of at least one higher Tg monomer (high Tg monomer as used herein means the Tg of the homopolymer of that monomer). The Tg of the high Tg monomer is at least 120° C., and preferably at least 130° C. Useful high Tg monomers include, but are not limited to, methacrylic acid, acrylic acid, itatonic acid, alpha methyl styrene, maleic anhydride, maleimide, isobornyl methacrylate, norbornyl methacrylate, t-butyl methacrylate, cyclohexyl methacrylate, acrylamide and methacrylamide. A copolymer having only one high Tg monomer cannot have acrylamide or methacrylamide as the sole high Tg monomer. A copolymer having two or more high Tg monomers could have a low level of acrylamide or methacrylamide as one of the high Tg monomer at a level of from 0 to 3 weight percent, preferably at less than 2 percent, more preferably at less than 1 percent and even at less than 0.5 weight percent. Preferably the level of any acrylamide and methacrylamide monomer units would be less than the level of other high Tg monomers in the terpolymer.

The acrylic copolymer may contain one or more other vinyl monomers copolymerizable with methyl methacrylate, including but not limited to other acrylate and methacrylate monomers or other ethylenically unsaturated monomers, included but not limited to, styrene, alpha methyl styrene, and acrylonitrile. Crosslinkers may also be present in the monomer mixture. Other methacrylate and acrylate monomers useful in the monomer mixture include, but are not limited to, methyl acrylate, ethyl acrylate and ethyl methacrylate, butyl acrylate, iso-octyl methacrylate and acrylate, lauryl acrylate and lauryl methacrylate, stearyl acrylate and stearyl methacrylate, isobornyl acrylate and methacrylate, methoxy ethyl acrylate and methacrylate, 2-ethoxy ethyl acrylate and methacrylate, dimethylamino ethyl acrylate and methacrylate monomers.

The acrylic glazing may also be a blend of an acrylic copolymer, and at least one polymer miscible with the acrylic copolymer. Preferably the blend is optically clear (having less than 15% haze, preferably less than 10% haze and more preferably less than 5% haze, as determined by ASTM D1003. The blend preferably contains at least 50 weight percent of methylmethacrylate units total in the combined polymers. The acrylic polymer glazing may be produced as a sheet by known processes, such as extrusion, cell cast, injection molding, compression molding, and continuous cast. The acrylic glazing has a thickness of from 0.025 mm to 13 mm, preferably from 0.05 mm to 7.5 mm, and more preferably from 0.5 mm to 6 mm. Cast sheet has a higher molecular weight, and may contain low levels of cross-linking monomers, which may provide a stronger sheet able to withstand higher temperatures or for longer durations without significant deformation.

The acrylic sheet of the invention may contain one or more additives in an effective amount, including but not limited to impact modifiers (which should be refractive index (RI) matched to the acrylic sheet matrix polymer for transparency, a RI match being within 0.02 units); UV stabilizers—which may be organic stabilizers or nano-sized inorganic particles for permanent UV protection; plasticizers; fillers; coloring agents; pigments; antioxidants; antistatic agents; surfactants; toners; refractive index matching additives; lubricants; and dispersing aids may also be present at low levels in the thermoplastic. Any additives should be chosen and used at minimal levels, to avoid interference with the transmission of solar radiation through the glazing. Low levels of polyvinylidene fluoride can also be blended into the acrylic sheet.

The surface of the acrylic glazing may be covered by one or more layers of other materials—for weatherability, dirt-shedding, abrasion resistance, or to improve the solar transmission. The additional layer(s) may be applied by coating, by lamination, with an adhesive or tie-layer, or in the case of extruded acrylic sheet by coextrusion. Useful outer polymeric coatings include fluoropolymer such as polyvinylidene fluoride (PVDF), and tetrafluoroethylene (TFE). The coating may contain any of the additives useful in the acrylic layer, especially UV absorbers and stabilizers—both organic and nano-inorganic. In one embodiment a scratch resistant coating, such as for example a titania-based coating can be used.

The high Tg acrylic sheet of the invention is useful as the front glazing on a photovoltaic module. The photovoltaic module could be rigid or flexible. The glazing material is preferably optically transparent and having a low haze of less than 5%, but can be optically hazy as long as the solar radiation transmission is high enough for effective conversion of light into electricity. In one embodiment, a matte surface on the outer surface of the PV module was found to increase the solar radiation transmission, even though optically hazy. In another embodiment, a nano-structured surface was found to improve the solar radiation transmission. A thin layer (coating or laminate) of a material such as polyinylidene fluoride, can be added to the exterior surface to increase the dirt shedding and provide a protective layer.

In addition to the front glazing material, the photovoltaic module contains an inner layer capable of converting solar radiation into electrical energy—which is generally encapsulated, and a backsheet.

The interior layer of the flexible photovoltaic module consists of a material that is capable of converting solar radiation into electrical current. The interior layer can be composed of materials known in the art for this purpose including, but not limited to, crystalline silicon, amorphous silicon, copper indium selenide (CIS), copper-indium gallium selenide (GIGS), quantum dots, cadmium telluride (CdTe), amorphous silicon/microcrystalline silicon blend.

The solar radiation collectors are generally fragile, and so are encapsulated for protection. The encapsulant can be any encapsulant known in the art. In one embodiment the encapsulant is poly(ethylene vinyl acetate) with peroxides and stabilizers, or thermoplastic encapsulants based on alpha olefins, ionomers, silicones, polyvinyl butyral, etc.

If needed, adhesion of the acrylic sheet to the encapsulant may be aided by means known in the art, including, but not limited to: the use of a tie layer, use of an adhesive, surface treatments such as corona discharge treatment, and functionalization of the acrylic sheet and/or encapsulant. Any adhesion aid should be selected to minimize interference with the transmission of solar radiation into the photovoltaic module.

The primary function of the back sheet is to protect the solar collection material from water, physical damage, UV radiation and oxygen, and to prevent short circuiting of the electrical transmission system.

The backsheet of the collector can be any material having the desired flexibility/rigidity for use in the photovoltaic module. Examples of useful back sheet materials include, but are not limited to metal, such as steel or aluminum, a polyvinyl fluoride (PVF) material, such as TEDLAR from DuPont (U.S. Pat. No. 6,646,196); an ionomer/nylon alloy (U.S. Pat. No. 6,660,930), polyethylene terephthalate (PET), polyethylene naphthalate (PEN), PVF/PET/PVF, laminate TPT, and PVDF (as described in U.S. application 60/944, 188, incorporated herein by reference). The backsheet could also be of an acrylic composition. These materials can be used for the backsheet alone or and in combination, and as a single or multi-layer construction. The backsheet can be transparent, translucent or opaque. In one embodiment, the backsheet is an acrylic material, that can be the same or different than that of the front glazing material, providing similar physical properties.

In addition to the glazing, the encapsulant layer(s), interior solar collecting layer and backsheet, the photovoltaic module may contain other components, including but not limited to concentrating lenses, adhesives and tie layers, UV absorbers, etc.

EXAMPLES

Example 1

3.0 mm thick acrylic sheets of poly(methylmethacrylate-methacrylic acid) (95.2/4.8 wt %) at a width of 26 inches were extruded at the die temperature of 480° F. The sheets had a Tg of 121° C., as measured by DSC during the second heating cycle using a heating rate of 20° C./min under $N_2$, high optical transmission of 92.4%, measured using a Perkin Elmer Lambda 850 in a transmission mode, along with the UV cut-off wavelength of ~400 nm. The low haze was measured at 0.7% in a BYK Gardner Haze Meter. The sheets exhibited excellent weathering performance as evidenced by an increase in E* of less than 1.0 units (CIELAB), and an increase in yellow index of less than 1.0 units (ASTM E313) under an accelerated Xenon arc weathering test (ASTM G155 cycle 2) after an exposure time of 5000 hrs.

Example 2

A bag casting process was used to produce a series of random copolymers based on methyl methacrylate and a given comonomer. In the bag cast process, a mixture of monomers, thermal initiators, and transfer agent was exposed to a temperature program optimized to initiate and complete the polymerization of used monomers. For analysis purposes, the obtained materials were subsequently grinded and press-molded into plaques with dimensions 2"×3"×0.125". The glass transition temperature was determined by DSC during the second heating cycle; the samples were cycled from −50 to 150° C., with a heating rate of 20° C./min and a cooling rate of 10° C./min.

Copolymers of methyl methacrylate and methacrylic acid were prepared and compared to previously described copolymers based on methyl methacrylate and methacrylamide (comparative examples). Based on the data presented below, both comonomers were shown to effectively increase the glass transition temperature of PMMA. In the case of methacrylamide, the comonomer's level was limited to 5 weight percent due to poor solubility in methyl methacrylate, therefore the maximum achievable glass transition temperature was measured at 123.5° C. In the case of methacrylic acid, a glass transition temperature of 133.9° C. was achieved in the presence of 10 weight percent methacrylic acid. Due to full miscibility with methyl methacrylate, this comonomer could be used at higher levels and allow higher glass transition temperatures to be achieved.

In addition to the glass transition data, methacrylamide was the only comonomer that worsened the desirable optical properties of PMMA, by imparting a significant amount of yellowness to the copolymer.

TABLE 1

| Composition (weight percent) | Tg (° C.) | Visual observation |
| --- | --- | --- |
| 100 MMA | 116.9 | Clear |
| 95 MMA/5 Methacrylic acid | 121.4 | Clear |
| 90 MMA/10 Methacrylic acid | 133.9 | Clear |
| 95 MMA/5 Methacrylamide | 123.5 | Yellow |
| 90 MMA/10 Methacrylamide | N/A | N/A |

Example 3

Generally, PV modules are manufactured by a lamination process in which many or most of the separate components are heated together at elevated temperatures and under pressure to enable sealing of the components in the module. High heat acrylic glazing materials enable higher lamination temperatures, and therefore a wider choice of encapsulant materials, than standard acrylic glazing materials as they retain their original part dimensions at higher temperatures than standard acrylic glazing materials.

In this example, pieces of a standard acrylic sheet (94.6 wt % methylmethacrylate/5.4 wt % ethylacrylate), and a high heat acrylic sheet (94.9 wt % methylmethacrylate/4.8 wt % methacrylic acid/0.3% ethyl acrylate) were laminated at various lamination temperatures for 30 minutes and the dimensional stability of the sheet evaluated. The glass transition temperature as measured via DSC during the second heating cycle using a heating rate of 20° C./min for the standard acrylic sheet is 104° C. and for the high heat acrylic sheet is 120° C. A P. Energy model L036A laminator was used for this experiment. FIG. 1 shows the normalized sheet thickness for both the high heat acrylic and the standard acrylic as a function of maximum lamination temperature. The normalized sheet thickness is calculated by dividing the thickness of a square sheet sample ⅛" in from the corner along the diagonal after being subjected to the lamination cycle by the thickness of the sample at the same location prior to the lamination process. A sheet that retains its original part dimensions has a normalized sheet thickness equal to 1. The closer the normalized sheet thickness value is to one, the better the sheet dimensions were retained during the lamination process. The normalized sheet thickness is larger for the high heat acrylic than the standard acrylic at all temperatures >90° C. indicating the high heat acrylic retains it's original part dimensions better than the standard acrylic at temperatures >90° C.

Example 4

PV modules must undergo rigorous standardized testing, such as those defined in IEC 61215 or UL1703 protocols, to achieve certification. One test in these protocols requires there be no visual change in the module after it has been exposed to 85° C., 85% relative humidity for 1000 hours. This requires the glazing materials themselves to also have little or no visual change after exposure to these conditions. Injection molded plaques, 6"×5⅞"×0.135", of both a high heat acrylic and a standard acrylic, were placed at an angle (25 degrees from vertical) in an environmental chamber and exposed to 85° C., 85% relative humidity for 521 hrs, after which time, the plaques were inspected visually. After exposure, the standard acrylic sample exhibited significant part deformation such that the part was bent at almost a 90° angle in the sample holder, whereas the high heat acrylic sample exhibited no part deformation.

TABLE 2

| Sample | Composition | Tg (° C.), as measured by DSC | Visual Inspection |
| --- | --- | --- | --- |
| high heat acrylic | 94.9 wt % MMA/4.8 wt % methacrylic acid/ 0.3 wt % ethylacrylate | 123.5 | no part deformation |
| standard acrylic | 94.6 wt % MMA/5.4 wt % ethylacrylate | 104 | significant part deformation |

What is claimed is:

1. A photovoltaic (PV) module comprising:
a) a front acrylic glazing material comprising a high Tg acrylic copolymer having a Tg of 120° C. or greater, as measured by differential scanning calorimetry (DSC), and a haze of less than 5% as determined by ASTM D1003, wherein said acrylic copolymer consists of only acrylic monomer units, having at least 85 weight percent of methylmethacrylate units, at least 4.8 weight percent of methacrylic acid monomer units, and optionally other acrylate and methacrylate monomers, wherein said front acrylic glazing is the outermost front layer of said PV module, exposed to the environment;
b) an interior layer capable of converting solar radiation into electricity; and
c) a back layer.

2. The PV module of claim 1, wherein said acrylic copolymer further comprises, in addition to the methyl methacrylate and methacrylic acid, one or more monomer units selected from the group consisting of isobornyl methacrylate, norbornyl methacrylate, t-butyl methacrylate, and cyclohexyl methacrylate.

3. The PV module of claim 1, wherein said acrylic copolymer has a Tg of greater than 130° C.

4. The PV module of claim 1, wherein said acrylic glazing is a blend of an acrylic polymer and at least one other polymer miscible with said acrylic polymer.

5. The PV module of claim 1, wherein the acrylic glazing material, comprises one or more additives selected from the group consisting of UV stabilizers, organic UV stabilizers, nano-sized inorganic particles for a permanent UV protection; plasticizers; fillers; coloring agents; pigments; antioxidants; antistatic agents; surfactants; toners; refractive index matching additives; lubricants and dispersing aids.

* * * * *